United States Patent
Ferran et al.

(10) Patent No.: US 10,569,891 B2
(45) Date of Patent: Feb. 25, 2020

(54) VEHICLE RECEIVING A SYSTEM FOR STORING ELECTRICAL ENERGY

(71) Applicant: Airbus SAS, Blagnac (FR)

(72) Inventors: Benoit Ferran, Paris (FR); Emmanuel Joubert, Issy-les-Moulineaux (FR); Clément Dinel, Issy-les-Moulineaux (FR)

(73) Assignee: AIRBUS SAS, Blagnac (FR)

( * ) Notice: Subject to any disclaimer, the term of this patent is extended or adjusted under 35 U.S.C. 154(b) by 115 days.

(21) Appl. No.: 16/017,728

(22) Filed: Jun. 25, 2018

(65) Prior Publication Data
US 2019/0002114 A1  Jan. 3, 2019

(30) Foreign Application Priority Data
Jun. 28, 2017 (FR) ...................... 17 55955

(51) Int. Cl.
*B64D 27/24* (2006.01)
*H02J 7/00* (2006.01)
(Continued)

(52) U.S. Cl.
CPC .............. *B64D 27/24* (2013.01); *B60L 58/12* (2019.02); *B60L 58/20* (2019.02); *G01R 31/008* (2013.01);
(Continued)

(58) Field of Classification Search
CPC ......... B64D 27/24; B60L 58/12; B60L 58/20; B60L 58/16; B60L 50/66; B60L 58/22;
(Continued)

(56) References Cited

U.S. PATENT DOCUMENTS

| 2014/0179535 A1* | 6/2014 | Stuckl | B64D 27/24 505/163 |
|---|---|---|---|
| 2014/0184142 A1* | 7/2014 | Bito | B60L 7/14 320/104 |
| 2014/0184153 A1 | 7/2014 | Saint-Leger et al. | |

FOREIGN PATENT DOCUMENTS

| FR | 2997582 | 5/2014 |
|---|---|---|
| FR | 3013007 | 5/2015 |

(Continued)

OTHER PUBLICATIONS

French Search Report, dated Mar. 14, 2018, priority document.

*Primary Examiner* — Rexford N Barnie
*Assistant Examiner* — Terrence R Willoughby
(74) *Attorney, Agent, or Firm* — Greer, Burns & Crain, Ltd.

(57) ABSTRACT

The vehicle receives batteries comprising cells arranged into at least one pack configured to be held in a vehicle structure, the pack being alternatively chosen from among at least one pack(P) and at least one pack(E) which are mechanically interchangeable and electrically substitutable. The pack(P) cells exhibit a maximum power density substantially higher than the pack(E) cells exhibit, and comprise cells exhibiting an energy density per unit mass substantially less than the pack(E) cells exhibit. The maximum electrical power of the pack(P) corresponds to the maximum electrical power needed to accomplish a first vehicle mission and the energy storage capacity of the pack(P) is at least sufficient to accomplish the first mission. The electrical energy storage capacity of the pack(E) corresponds to the electrical energy storage capacity needed to accomplish a second vehicle mission and the maximum electrical power is at least sufficient to accomplish the second mission.

9 Claims, 3 Drawing Sheets

(51) Int. Cl.
  *G01R 31/00* (2006.01)
  *H01M 2/10* (2006.01)
  *G01R 31/378* (2019.01)
  *H01M 10/44* (2006.01)
  *B60L 58/20* (2019.01)
  *B60L 58/12* (2019.01)
  *B60K 1/04* (2019.01)
  *B60L 58/22* (2019.01)
  *B60L 50/60* (2019.01)
  *B60L 58/16* (2019.01)

(52) U.S. Cl.
  CPC ........ *G01R 31/378* (2019.01); *H01M 2/1077* (2013.01); *H01M 2/1083* (2013.01); *H01M 10/441* (2013.01); *H02J 7/0063* (2013.01); *B60K 1/04* (2013.01); *B60K 2001/0494* (2013.01); *B60L 50/66* (2019.02); *B60L 58/16* (2019.02); *B60L 58/22* (2019.02); *B60L 2200/10* (2013.01); *B60L 2240/547* (2013.01); *H01M 2220/20* (2013.01)

(58) Field of Classification Search
  CPC .......... B60L 2240/547; B60L 2200/10; H01M 10/441; H01M 2/1077; H01M 2/1083; H01M 2220/20; G01R 31/378; G01R 31/008; H02J 7/0063; B60K 2001/0494; B60K 1/04
  See application file for complete search history.

(56) References Cited

FOREIGN PATENT DOCUMENTS

| | | |
|---|---|---|
| WO | 2012128285 | 9/2012 |
| WO | 2012160292 | 11/2012 |

\* cited by examiner

VEHICLE RECEIVING A SYSTEM FOR STORING ELECTRICAL ENERGY

CROSS-REFERENCES TO RELATED APPLICATIONS

This application claims the benefit of the French patent application No. 1755955 filed on Jun. 28, 2017, the entire disclosures of which are incorporated herein by way of reference.

FIELD OF THE INVENTION

The invention relates to the management of electrical energy for an electrically-powered vehicle. It falls within the field of the arrangement of battery packs of accumulators within a vehicle, and relates more particularly to a system for storing electrical energy on an aircraft.

More particularly, the invention relates to a vehicle such as an aircraft or to a vehicle from the automobile, railway or naval fields, comprising a system for storing electrical energy for its propulsion.

BACKGROUND OF THE INVENTION

The batteries of electrical accumulators, hereinafter denoted "batteries," designed for storing an energy that is to be returned in electrical form, are characterized, in particular, by their storage capacities, in other words the total energy that they are capable of returning in the form of usable electrical currents and by their capability to deliver a maximum power in use. These two characteristics depend on the technologies used in the cells of the batteries and have consequences on the dimensions of the batteries and on their storage capacity per unit mass (J/g).

Thus, in practice, two main categories of batteries are associated with their uses: batteries designed for applications of the energy type, when the requirement is principally a high storage capacity for the battery, for example in order to provide the maximum autonomy to a system supplied by the battery, these batteries being sometimes denoted "batteries of the energy type;" and batteries designed for applications of the power type when the requirement is to deliver high powers in use, in particular in order to respond to high instantaneous power demands, for example for the power supply of power actuators driven by certain systems, these batteries being sometimes denoted "batteries of the power type."

This distinction between "battery of the energy type" and "battery of the power type" is however artificial since all the types of batteries are characterized by their capacity for storing, and more particularly for returning, energy, and by their maximum current, and hence their maximum power delivered, and it therefore only corresponds to the extremes of a classification of the batteries depending on these two characteristics, which in practice prove to be antinomic.

Energy batteries supply a quantity of energy that is relatively large for a given mass but with discharge current intensities that are relatively low. Conversely, power batteries accept discharge current intensities that are relatively high for a given mass but, on the other hand, only supply a relatively small usable quantity of energy.

The Ragone diagram is known to those skilled in the art for illustrating the variation of the maximum mass power ratio of accumulators as a function of their mass storage capacity, for various cell technologies.

This diagram illustrates that, for a given cell technology, the capacity decreases as the maximum power increases.

A choice with regard to a model of batteries is therefore generally made according to the applications.

For example, in the field of vehicles with electric propulsion, the search for maneuverability and for high accelerations leads to the use of batteries of the "power" type and with capacities limited to the needs of the mission to be carried out so as to limit their mass.

On the contrary, the search for a significant autonomy or for a wide range of action leads to the use of batteries of the "energy" type and with limited maximum powers for the needs of the mission so as to also limit their mass.

In order to illustrate these aspects, in the case of an aircraft with electric propulsion, an aerobatics aircraft, demanding in terms of power but only needing a limited autonomy, will be equipped with batteries of the "power" type, whereas a touring aircraft, demanding in terms of autonomy but with no need for excessive power, will be equipped with batteries of the "energy" type.

Such a specialization is however detrimental when a device, in particular a vehicle, may be used in missions that are sometimes demanding in terms of power, and other times are demanding in terms of energy.

SUMMARY OF THE INVENTION

An aim of the present invention is to overcome the aforementioned drawbacks by providing a system for storing electrical energy of a vehicle comprising battery packs dimensioned according to the needs in autonomy for the accomplishment of missions of the vehicle.

Another objective of the present invention is to provide a vehicle designed to implement such an energy storage system.

For this purpose, according to a first aspect, the present invention relates to a system for storing electrical energy of a vehicle, the storage system comprising batteries comprising cells, the batteries being arranged in packs designed to be held within a structure of the vehicle.

The storage system comprises at least one pack of a first type or pack(P) and at least one pack of a second type or pack(E) being mechanically interchangeable and electrically substitutable. The pack(P) is designed in such a manner as to comprise cells exhibiting a maximum power density substantially higher than that exhibited by the cells of the pack(E), and is designed so as to comprise cells exhibiting an energy density per unit mass substantially less than that exhibited by the cells of the pack(E). This is so that:

the maximum electrical power of the at least one pack(P) corresponds to the maximum electrical power needed for the vehicle to undertake a first mission, the energy storage capacity of the at least one pack(P) being at least a capacity needed to undertake the first mission; and the electrical energy storage capacity of the at least one pack(E) corresponds to the electrical energy storage capacity needed for the vehicle to undertake a second mission, the maximum electrical power being at least the electrical power needed to undertake the second mission.

Thus, at an equivalent maximum electrical power, a pack(P) has a lower mass than a pack(E). The installation of a pack(P) in a vehicle advantageously allows the maneuverability and the reactivity of the vehicle to be enhanced.

The present invention also allows the configuration, in a simplified manner, of one and the same vehicle to be provided so as to make it capable of one or the other mission without the burden of the implementation of a pack which would be capable of satisfying both requirements.

In particular embodiments, the invention furthermore exhibits the following features, implemented separately or in each of their technically operable combinations.

In particular embodiments of the invention, the pack(P) and pack(E) are designed so as to deliver a substantially identical maximum electrical power.

The fact that the pack(P) and the pack(E) deliver a maximum electrical power identical to each other has the advantage that the vehicle can comprise a single electrical distribution network for the power chain receiving this electrical power.

In particular embodiments of the invention, each pack(P) and pack(E) comprises means of identification of the pack to which it is attached, designed to be read by an electrical management system of the vehicle.

In particular embodiments of the invention, the pack(P) and pack(E) comprise a management system connected to means for acquiring data representative of parameters of the battery pack, including a nominal maximum intensity of the current able to be delivered, and the state of charge, the state of health and the electrical energy storage capacity of the pack, the management system being configured so as to transmit the data representative of these parameters to a monitoring and control device for power electrical equipment of the vehicle, when one of the pack(P) and pack(E) is installed in the vehicle.

When the monitoring and control device of the power equipment of the vehicle has received the data representative of parameters of the battery pack, it is able to adapt the energy consumption and to avoid any overload or overdischarge likely to be detrimental for the lifetime of the batteries of the battery packs. By virtue of these features, the ageing of the battery pack is optimized and thus, the lifetime of the battery packs is maximized.

The data acquisition means may be formed by simulation means and/or by measurement means such as sensors.

In particular embodiments of the invention, the management system is designed to record the data representative of parameters of the pack(P) and pack(E).

Thus, data representative of parameters of a battery pack installed in a vehicle may be recorded, at the completion of the mission of the vehicle. This data may be exploited when the battery pack is powered up with a view to undertaking the next mission.

Another subject of the present invention relates to a vehicle designed to implement a system for storing electrical energy such as previously described, comprising:
  second guiding mechanisms rigidly fixed to a structure of the vehicle provided to cooperate with first guiding mechanisms for a pack(P) or for a pack(E),
  connection terminals designed to be connected to electrical terminals of a pack(P) or of a pack(E),
  a device for monitoring and controlling a power electrical unit of equipment supplied with electricity by one of the pack(P) and pack(E), the device implementing control laws that are a function of the maximum electrical power that can be supplied by the pack(P) and pack(E).

By virtue of these features, the aircraft is able to be supplied by any type of pack, irrespective of the maximum electrical power that it can deliver, without requiring any modification of the power electronics interfaces, notably electrical connectors, of the aircraft.

From one flight to another, the aircraft is therefore designed to respond to a need for autonomy or to a need for maximum electrical power according to the requirements defined by a mission to be undertaken.

In embodiments of the invention, the monitoring and control device is configured such that the pack(P) and pack(E) supply a drive motor of the vehicle with electricity.

In particular embodiments, the vehicle is an aircraft comprising at least two wings within which the second guiding mechanisms extend and each comprising:
  an opening for introducing pack(P) and pack(E) designed to be closed off, and
  at least one connection terminal.

Thus, each wing comprises at least one battery pack. Preferably, the battery pack or packs disposed within each one are chosen such that each wing has substantially the same mass in order to avoid any imbalance of the aircraft and to ensure its stability.

In embodiments of the invention, the openings for introducing pack(P) and pack(E) of batteries are formed in a root of each wing.

In embodiments of the invention each introduction opening comprises at least one shutter that is mobile between a closed-off position of the opening and a clear access position of the opening.

According to another aspect, the present invention relates to a method for dimensioning battery pack(P) and battery pack(E) of a system for storing electrical energy to be installed in a vehicle for the accomplishment of a mission of the vehicle comprising steps for:
  determination of a maximum output voltage of a pack(P) and of a pack(E) and of the maximum mass of the pack(P) and pack(E) as a function of the constraints of the vehicle,
  definition of critical requirements for the accomplishment of missions of the vehicle, from between a requirement for maximum electrical power and a requirement for electrical energy storage capacity,
  dimensioning of at least one pack(P) so as to meet a requirement for maximum power defined by a first mission, and to meet a requirement for a minimum electrical energy storage capacity acceptable for the first mission;
  dimensioning of at least one pack(E) so as to meet a requirement for electrical energy storage capacity defined by a second mission, and to meet a requirement for a minimum electrical power acceptable for the second mission.

BRIEF DESCRIPTION OF THE DRAWINGS

The invention will be better understood upon reading the following description, presented by way of non-limiting example, and with reference to the figures which show.

In these figures, identical numerical references from one figure to another denote identical or similar elements. Furthermore, for the sake of clarity, the drawings are not to scale, unless otherwise stated.

DETAILED DESCRIPTION OF THE PREFERRED EMBODIMENTS

Figure 1:
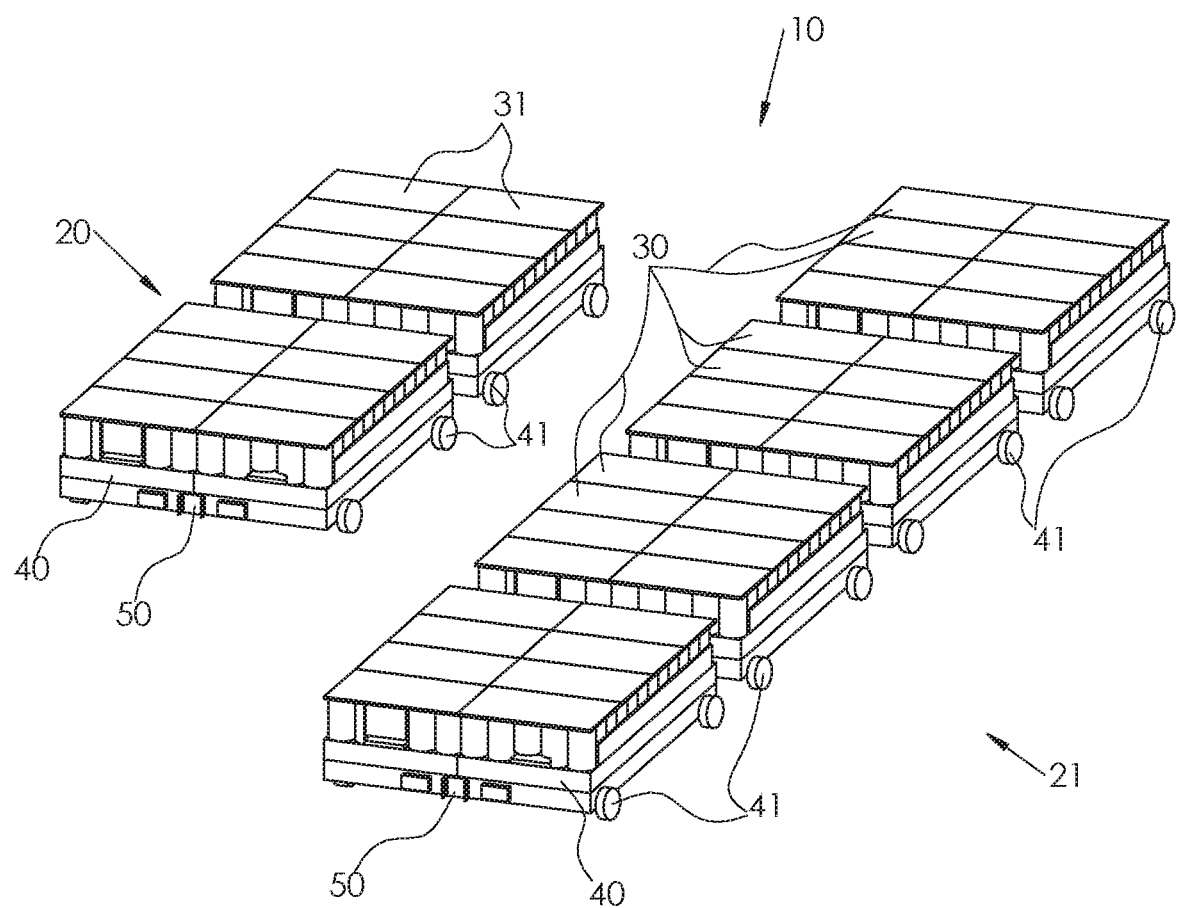
FIG. 1: a perspective view of two battery packs of a storage system according to the invention.

The present invention relates to a system 10 for storing electrical energy of a vehicle, as shown schematically in FIG. 1, comprising a plurality of batteries of cells.

The storage system 10 comprises at least one pack(P) 20 of batteries 30, and at least one pack(E) 21 of batteries 31, the pack(P) and pack(E) being mechanically interchangeable and electrically substitutable and respectively comprising batteries whose cells nominally exhibit maximum power densities substantially different from one another and energy densities per unit mass substantially different from one another.

More precisely, the pack(P) 20 and pack(E) 21 are mechanically interchangeable in the sense that they are designed in such a manner that a pack(P) can replace a pack(E), and vice versa, within the structure of the vehicle, according to the needs of a mission that it must accomplish.

The pack(P) 20 and pack(E) 21 are electrically substitutable in the sense that they are designed to deliver an electrical energy compatible with the electrical power supply expected by the vehicle to which the packs may be alternatively connected.

The pack(P) 20 and pack(E) 21 are designed to be held within a structure of the vehicle in order to supply electricity to a power electrical unit of equipment of the vehicle used in the operation of the vehicle, in particular, such as one or more drive motors.

The pack(P) 20 and pack(E) 21 comprise a support chassis 40 on which the batteries 30, 31 of cells are fixed by any means of attachment known to those skilled in the art. The support chassis 40 comprises first guiding mechanisms 41, rigidly attached to the support chassis 40, designed to cooperate with second guiding mechanisms 42 rigidly attached to the structure of the vehicle, not shown, in such a manner as to be able to guide and precisely place the pack(P) 20 or the pack(E) 21 in the vehicle during insertion or extraction operations.

The first guiding mechanisms 41 are, for example, rollers or sliding shoes fixed to the support chassis 40 and the second guiding mechanisms 42 are for example rails rigidly attached to the structure of the vehicle, in which the rollers or the sliding shoes travel.

The pack(P) 20 and pack(E) 21 comprise locking means (not shown in the figures) provided for immobilizing the support chassis 40 with respect to the structure of the vehicle when one of the pack(P) 20 or pack(E) 21 is installed in the vehicle.

The locking means implement any type of devices designed to immobilize a load carried by a slider. They may, for example, implement mobile end-stops with manual, automatic or remote controlled positioning. They may also implement quick-positioning attachments such as locking pins, in particular locking pins with a bead locking.

In any case, and in view of the mass of a battery pack and of the damage that an uncontrolled displacement of a pack could produce when the vehicle is in motion, the locking device implemented is designed to avoid an unacceptable probability of failure, by a suitable dimensioning of the structure of the locking mechanism (structure referred to as "safe life"), and/or by a redundancy of locking mechanisms (structure referred to as "fail safe"), and by means of monitoring or of safe locking so as to prevent a locking failure.

The pack(P) 20 and pack(E) 21 also comprise electrical terminals 50 designed to be connected to connection terminals of the vehicle. The electrical terminals 50 are preferably arranged on the support chassis 40 such that each electrical terminal 50 is sitting opposite a connection terminal to which it must be electrically connected when one of the pack(P) 20 or pack(E) 21 is installed in the vehicle.

In one embodiment, the electrical connection is made by a mechanical crimping of lugs onto the electrical terminals and/or the connection terminals.

In one embodiment, the electrical connection is made by means of automatic 'quick-connect' connectors when a pack(P) 20 or when a pack(E) 21 is installed.

The pack(P) 20 and pack(E) 21 are dimensioned according to their capacity to deliver a maximum electrical power and according to their electrical energy storage capacity, for the accomplishment of missions of the vehicle defining either a critical requirement in terms of maximum electrical power, or defining a critical requirement in terms of storage capacity.

More particularly, the pack(P) 20 of batteries 30 is primarily designed to meet a need for maximum electrical power in use of the vehicle with an energy storage capacity reduced at the most to a minimum acceptable for the mission defining the critical requirement in terms of maximum power. The maximum electrical power of the at least one pack(P) corresponds to the maximum electrical power needed for the accomplishment of a first mission of the vehicle, the energy storage capacity of the at least one pack(P) being at least a capacity needed to accomplish the first mission.

The pack(P) is designed so as to comprise cells exhibiting a maximum power density substantially higher than that exhibited by the cells of the pack(E), and is designed so as to comprise cells exhibiting an energy density per unit mass substantially lower than that exhibited by the cells of the pack(E).

Thus, at an equivalent maximum electrical power, a pack(P) has a lower mass than a pack(E). The installation of a pack(P) in a vehicle advantageously allows the maneuverability and the reactivity of the vehicle to be enhanced.

The pack(E) 21 of batteries 31 is primarily designed to meet a requirement for electrical energy storage capacity, first and foremost to meet a need for autonomy of the vehicle, to the detriment of a maximum power able to be delivered reduced at the most to a minimum acceptable for the mission defining the critical requirement in terms of storage capacity.

The electrical energy storage capacity of the at least one pack(E) corresponds to the electrical energy storage capacity needed for the accomplishment of a second mission of the vehicle, the maximum electrical power being at least the electrical power needed to accomplish the second mission.

Characterizing a critical requirement of a mission by the maximum power to be supplied or by the electrical energy storage capacity needed for the accomplishment of the mission allows the mass of the pack(P) 20 and pack(E) 21 to be optimized by dimensioning it according to this critical requirement and according to a minimum admissible for the non-critical requirements.

The arrangement of the batteries 30, 31, respectively within each pack(P) 20 and pack(E) 21, is available to those skilled in the art for adjusting the voltage, the maximum current intensity and the electrical energy storage capacity of the pack(P) and pack(E) as a function of the constraints of the mission of the vehicle.

It will be obvious to those skilled in the art that the pack(P) 20 and the pack(E) 21 must also comply with the constraints of the vehicle, in particular in terms of volumes and of masses; these aspects are described hereinbelow.

In one embodiment, the electrical terminals 50 of the pack(P) 20 and of the pack(E) 21 are identical such that the various battery packs may be connected indiscriminately onto the same connection interface of the vehicle and of the system for charging or for maintaining the charge when the pack(P) 20 or the pack(E) 21 is stored outside of the vehicle. In addition to a simplification of the storage system 10, this feature participates in the reduction of the mass of the vehicle given that it is not necessary to provide two types, or more, of connection terminals of the vehicle.

Each pack(P) 20 and pack(E) 21 also carries means of identification, with or without contact, of the type of pack to which it is attached and which can be read by the electrical management system of the vehicle. These means of identification may be mechanical (e.g., an end-stop acting on a detector) and/or optical (e.g., an optical detector of a target or reading of a code), and/or magnetic (e.g., a proximity sensor), and/or electrical (e.g., an electrical contact), and/or radiofrequency (e.g., a radio chip).

The pack(P) 20 and pack(E) 21 may be configured to be charged by a single charging station. The charging time of a pack(P) 20 is shorter than that of a pack(E) 21; this is notably due to the fact that the internal resistance of the batteries 30 of the pack(P) 20 is lower than that of the batteries 31 pack(E) 21, and to the fact that the batteries 30 of the pack(P) 20 accept charging current intensities higher than those of the pack(E) 21.

The means of identification of the pack(P) 20 and pack(E) 21 may advantageously be read by a management module of the charging station so as to identify the type of pack connected to the station. The management module of the charging station is configured for implementing charging profiles according to the type of pack connected.

The pack(P) 20 and pack(E) 21 comprise a management system connected to means for acquiring data representative of parameters of the pack. These parameters may be characterized by an acceptable nominal maximum intensity of the charging current, a nominal maximum intensity of the current able to be delivered, by a state of charge, by a state of health, by a storage capacity and a temperature of the cells which compose the respective batteries 30 or 31 of the pack(P) 20 and pack(E) 21.

The management system for the pack(P) 20 and pack(E) 21 is configured so as to transmit the data representative of these parameters to a device for monitoring and controlling a power electrical unit of equipment of the vehicle, when it is installed in the vehicle.

The management system for the pack(P) 20 and pack(E) 21 may also transmit to the monitoring and control device data representative of the energy state of the pack(P) 20 or of the pack(E) 21 when the pack to which it is attached is installed in the vehicle. The energy state represents the state of availability of electrical energy of the cells of the pack(P) 20 and pack(E) 21.

The communication of data representative of parameters of the pack(P) 20 and pack(E) 21 provides the ability to notably monitor critical quantities for the preservation of the lifetime of the cells composing the batteries 30, 31 of the packs 20, 21.

More precisely, when the device for monitoring and controlling the power equipment of the vehicle has received the data representative of parameters of the pack(P) 20 or of the pack(E) 21 installed in the vehicle, it is able to regulate the energy consumption in order to avoid, for example, any over-discharging or overheating of the cells likely to be detrimental to the lifetime of the batteries 30, 31. By virtue of these features, the ageing of the pack 20, 21 of batteries 30, 31 is minimized and, thus, the lifetime of the packs 20, 21 of batteries 30, 31 is maximized.

The means for acquiring data may be formed by calculation and/or measurement means, depending on the parameters to be monitored. For example, the temperature of the cells may be determined by virtue of temperature probes known per se to those skilled in the art, and the states of charge, the state of health and the state of charge of the cells may be determined by calculation and/or by measurements of voltages under specific conditions.

By way of example, the state of charge is determined by an algorithm, using the voltage, current and temperature measurements for each cell or group of cells, and using onboard charts determined by tests.

The management systems for the pack(P) 20 and pack(E) 21 are configured so as to modulate the data coming from the calculation means as a function of the configuration of the pack(P) 20 and pack(E) 21, notably of the number of batteries that they comprise and of the number of cells composing each of the batteries.

In one embodiment, the management system is designed to record data representative of parameters of the pack(P) 20 and pack(E) 21, for example in order to save the data representative of parameters of a pack(P) 20 or of a pack(E) 21 installed in a vehicle at the completion of a mission. The saved data may subsequently be exploited when the pack(P) 20 or pack(E) 21 is powered up in order to recharge the pack and for the next mission.

The monitoring and control device of the vehicle is configured for implementing control laws for the power electrical equipment according to the type of pack installed in the vehicle.

Thus, the vehicle is designed to be powered by any type of pack without the need for modification of the power electronics and control interfaces.

In the following part of the text, the vehicle designed to implement the electrical energy storage system 10 is an aircraft 1 comprising at least two wings 60. A cross-sectional view of a wing in which a battery pack is installed is shown in FIG. 2.

In one exemplary embodiment of the invention, each wing comprises at least one pack(P) 20 or at least one pack(E) 21. Preferably, the wings 60 comprise an identical mass of batteries 30, 31 so as to ensure the symmetry of the wing loadings. For example, each wing comprises an identical number of the same type of pack.

Figure 2:
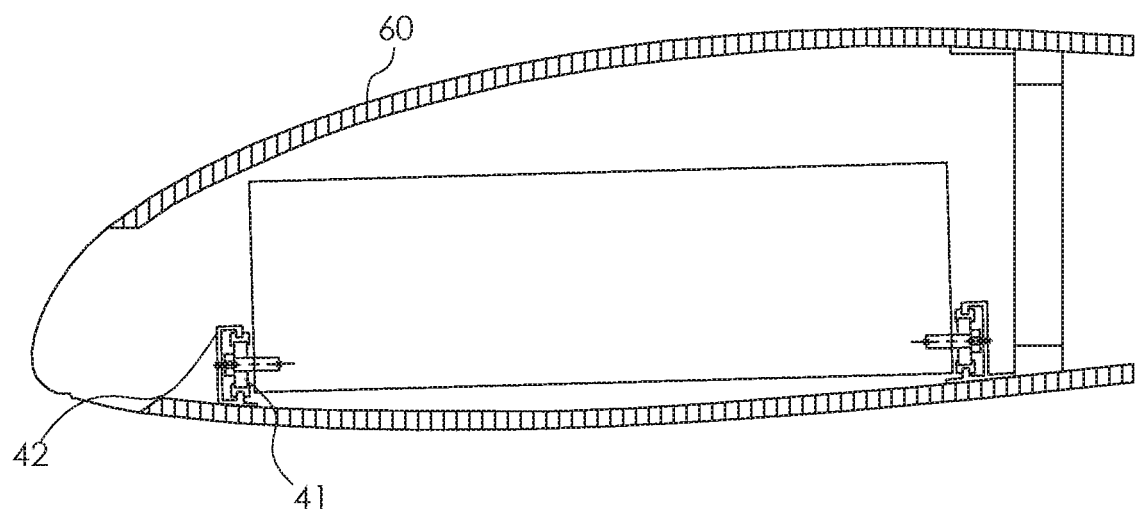
FIG. 2: a schematic cross-sectional view of one of the battery packs according to FIG. 1 installed in a wing of an aircraft.
Figure 3:
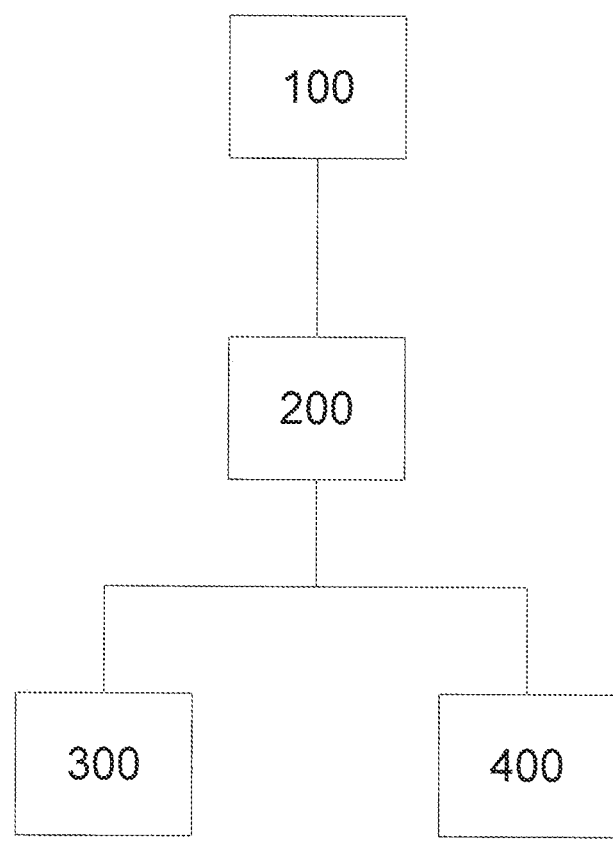
FIG. 3: a flow diagram showing the steps of a method for determining characteristics of a battery pack of a system for storing electrical energy to be installed in a vehicle.
Figure 4:
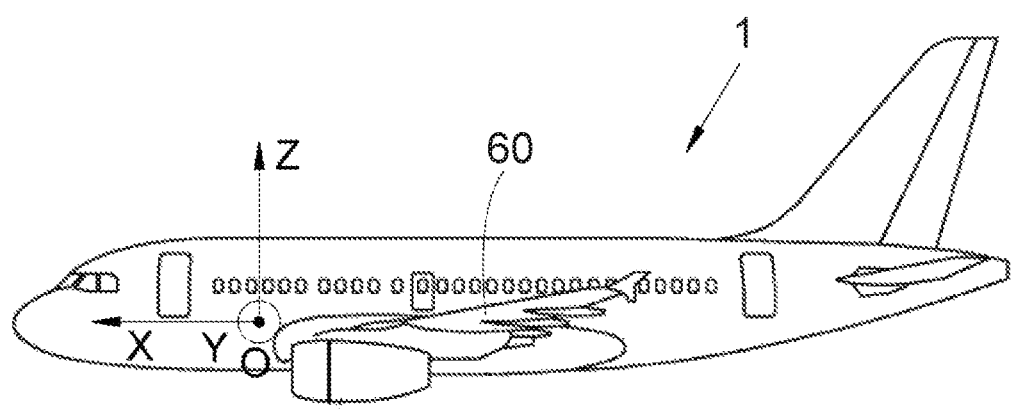
FIG. 4: an aircraft conforming to one embodiment of the invention.

The second guiding mechanisms 42 provided for cooperating with first guiding mechanisms 41 of a support chassis 40 of the pack(P) 20 and pack(E) 21 are rigidly attached to the internal structure of each of the wings 60, such as shown in FIG. 2, in such a manner that they extend within each of the wings 60.

Each wing comprises an opening for introduction of the pack(P) 20 and pack(E) 21 through which the pack(P) 20 or pack(E) 21 can be introduced so that the first guiding mechanisms 41 cooperate with the second guiding mechanisms 42.

Preferably, these introduction openings are formed in a root of the wings. The second guiding mechanisms 42 then extend in a direction substantially parallel to a longitudinal axis of the wings 60.

The introduction of the pack(P) 20 and pack(E) 21 into the wings 60 is carried out following the installation of the wings 60, the introduction openings being closed off when the wings 60 are fixed to the fuselage of the aircraft 1.

In other exemplary embodiments of the invention, the introduction openings are formed by shutters that are mobile between a closed-off position of the opening and a clear access position of the opening.

The present invention also relates to a method for determining the characteristics of a pack(P) 20 or pack(E) 21 to be installed in a vehicle for the accomplishment of a mission of the vehicle. This method comprises steps for:

100—determination of a maximum output voltage of a pack(P) 20 and of a pack(E) 21 and of the maximum mass of the pack(P) 20 and pack(E) 21 according to the constraints of the vehicle,

200—definition of critical requirements for the accomplishment of missions of the vehicle, from between a requirement for maximum electrical power and a requirement for electrical energy storage capacity,

300—dimensioning of at least one pack(P) 20 so as to comply with a requirement for maximum power defined by a first mission, and with a requirement for a minimum electrical energy storage capacity acceptable for the first mission;

400—dimensioning of at least one pack(E) 21 so as to comply with a requirement for electrical energy storage capacity defined by a second mission, and with a requirement for a minimum electrical power acceptable for the second mission.

More generally, it should be noted that the embodiments and their implementation considered hereinabove have been described by way of non-limiting examples, and that other variants may accordingly be envisaged.

Notably, the invention has been described by principally considering an aircraft. However, according to other examples, nothing excludes other types of vehicle being considered.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A vehicle receiving batteries comprising cells, the batteries being arranged in at least one pack designed to be held within a structure of the vehicle, wherein the pack is alternatively chosen from among at least one pack of a first type, having a first power/energy density characteristic, and at least one pack of a second type, having a second power/energy density characteristic, the two types of packs being mechanically interchangeable and electrically substitutable, the pack with the first power/energy density characteristic comprising cells exhibiting a maximum power density that is substantially higher than that exhibited by the cells of the pack with the second power/energy density characteristic and, the pack with the second power/energy density characteristic comprising cells exhibiting an energy density per unit mass substantially lower than that exhibited by the cells of the pack with the first power/energy density characteristic, and such that:

a maximum electrical power of the at least one pack with the first power/energy density characteristic corresponds to a maximum electrical power needed for an accomplishment of a first mission of the vehicle, an energy storage capacity of the at least one pack with the first power/energy density characteristic being at least a capacity needed to accomplish the first mission; and an electrical energy storage capacity of the at least pack with the second power/energy density characteristic corresponds to an electrical energy storage capacity needed for an accomplishment of a second mission of the vehicle, a maximum electrical power being at least the electrical power needed to accomplish the second mission, the vehicle comprising:

second guiding mechanisms rigidly attached to a structure of the vehicle provided so as to cooperate with first guiding mechanisms of a pack with the first power/energy density characteristic or of a pack with the second power/energy density characteristic, connection terminals designed to be connected to electrical terminals of a pack with the first power/energy density characteristic or of a pack with the second power/energy density characteristic, a device for monitoring and controlling a power electrical unit of equipment supplied with electricity by one of the pack with the first power/energy density characteristic and pack with the second power/energy density characteristic, the device implementing control laws that are a function of the maximum electrical power able to be supplied by the pack with the first power/energy density characteristic and the pack with the second power/energy density characteristic.

2. The vehicle according to claim 1, in which the pack with the first power/energy density characteristic and pack with the second power/energy density characteristic are designed to deliver a substantially identical maximum electrical power.

3. The vehicle according to claim 1, in which at least one of:

each pack with the first power/energy density characteristic, or each pack with the second power/energy density characteristic, comprises means of identification of the pack, readable by an electrical management system of the vehicle.

4. The vehicle according to claim 1, wherein at least one of:

the pack with the first power/energy density characteristic, or the pack with the second power/energy density characteristic, comprise a management system connected to means for acquiring data representative of parameters of the pack, comprising at least one of:

a nominal maximum intensity of a current able to be delivered, a state of charge, a state of health, or the electrical energy storage capacity of the pack, the management system being configured in such a manner as to transmit data representative of these parameters to the monitoring and control device of the power electrical equipment, when one of the pack with the first power/energy density characteristic and pack with the second power/energy density characteristic is installed in the vehicle.

5. The vehicle according to claim 4, wherein the management system is configured to record data representative of parameters of at least one of the pack with the first power/energy density characteristic or the pack with the second power/energy density characteristic.

6. The vehicle according to claim 1, wherein the monitoring and control device is configured such that the pack with the first power/energy density characteristic and pack with the second power/energy density characteristic supply electricity to a drive motor of the vehicle.

7. The vehicle according to claim 1, this vehicle being an aircraft comprising at least two wings within which the second guiding mechanisms extend and each comprising:

an opening for introducing the pack with the first power/energy density characteristic and the pack with the second power/energy density characteristic configured to be closed off, and at least one connection terminal.

8. The vehicle according to claim 7, wherein the openings for introduction of the pack with the first power/energy density characteristic and the pack with the second power/energy density characteristic are formed within a root of each wing.

9. The vehicle according to claim 8, wherein each introduction opening comprises at least one shutter mobile between a closed-off position of the opening and a clear access position of the opening.

* * * * *